(12) United States Patent
Chen et al.

(10) Patent No.: US 9,330,808 B2
(45) Date of Patent: May 3, 2016

(54) PASSIVATION COMPOSITION AND ITS APPLICATION

(71) Applicant: ETERNAL CHEMICAL CO., LTD., Kaohsiung (TW)

(72) Inventors: Wei-Kai Chen, Kaohsiung (TW); Tu-Yi Wu, Kaohsiung (TW)

(73) Assignee: ETERNAL MATERIALS CO., LTD., Kaohsiung (TW)

(*) Notice: Subject to any disclaimer, the term of this patent is extended or adjusted under 35 U.S.C. 154(b) by 0 days.

(21) Appl. No.: 14/228,965

(22) Filed: Mar. 28, 2014

(65) Prior Publication Data

US 2015/0129539 A1  May 14, 2015

(30) Foreign Application Priority Data

Nov. 8, 2013  (TW) .............................. 102140659 A (51) Int. Cl.
| | | |
|---|---|---|
| *H01L 21/00* | (2006.01) | |
| *H01B 1/12* | (2006.01) | |
| *G03F 7/00* | (2006.01) | |
| *H01L 51/00* | (2006.01) | |

(Continued)

(52) U.S. Cl.
CPC ... *H01B 1/12* (2013.01); *C08J 7/12* (2013.01); *G02F 1/13439* (2013.01); *G03F 7/00* (2013.01); *H01L 51/0015* (2013.01); *C08G 73/0266* (2013.01); *C08G 2261/3221* (2013.01); *C08G 2261/3223* (2013.01); *C08G 2261/51* (2013.01); *C08G 2261/65* (2013.01); *C08G 2261/72* (2013.01); *H01L 51/0037* (2013.01)

(58) Field of Classification Search
CPC ........ C09K 13/02; C09K 13/04; C09K 15/02; H01B 1/12; H01B 1/20; H01B 1/24; H01B 1/125; H01L 21/02112; H01L 21/02129; H01L 21/02164; H01L 21/02337
USPC .............. 252/79.1, 79.2, 79.3, 79.4; 438/745, 438/750, 753, 754, 760, 770, 778
See application file for complete search history.

(56) References Cited

U.S. PATENT DOCUMENTS

| | | | | |
|---|---|---|---|---|
| 4,268,601 A | * | 5/1981 | Namiki et al. ................ | 430/159 |
| 7,960,328 B2 | * | 6/2011 | Visintin et al. ................ | 510/175 |

(Continued)

FOREIGN PATENT DOCUMENTS

| | | |
|---|---|---|
| EP | 1054414 | 3/2003 |
| JP | 2011-054617 | 3/2011 |
| WO | 2013133668 A1 | 9/2013 |

OTHER PUBLICATIONS

Taiwanese Office Action in Taiwanese Patent Application No. 102140659 dated Jul. 9, 2015.

*Primary Examiner* — Lan Vinh
(74) *Attorney, Agent, or Firm* — Greer, Burns & Crain, Ltd.

(57) ABSTRACT

A passivation composition and use of the composition in a method of forming a conductive pattern are provided. The passivation composition includes an oxidizing agent, an inorganic base with a general formula $M(OH)_n$ and a solvent, wherein M is a metal ion and n is the valence number of the metal ion. The method includes the following steps: (a) forming a polymer conductive layer on a substrate, wherein the polymer conductive layer is consisting of a first area and a second area. The first area is corresponding to a conductive area to be formed; and (b) passivating the second area by using the passivation composition to reduce the conductivity of the second area and form the conductive pattern on the substrate.

6 Claims, 6 Drawing Sheets

(51) Int. Cl.
*C08J 7/12* (2006.01)
*G02F 1/1343* (2006.01)
*C08G 73/02* (2006.01)

(56) References Cited

U.S. PATENT DOCUMENTS

| | | | |
|---|---|---|---|
| 8,883,543 B2 * | 11/2014 | Okuuchi | H01L 31/02363 257/E25.007 |
| 2003/0224201 A1 * | 12/2003 | Kawakami et al. | 428/672 |
| 2008/0202551 A1 * | 8/2008 | Joo | 134/1.3 |
| 2009/0082240 A1 * | 3/2009 | Nukui et al. | 510/176 |
| 2009/0221777 A1 * | 9/2009 | Chiba et al. | 526/262 |
| 2010/0035433 A1 * | 2/2010 | Takemiya et al. | 438/693 |
| 2010/0167458 A1 * | 7/2010 | Shin | H01L 31/022425 438/73 |
| 2010/0236582 A1 * | 9/2010 | Heintz et al. | 134/26 |
| 2012/0017971 A1 * | 1/2012 | Moslehi | H01L 31/042 136/251 |
| 2012/0031872 A1 * | 2/2012 | Sekiguchi | B82Y 10/00 216/13 |

* cited by examiner

PASSIVATION COMPOSITION AND ITS APPLICATION

CLAIM FOR PRIORITY

This application claims the benefit of Taiwan Patent Application No. 102140659, filed on Nov. 8, 2013.

CROSS-REFERENCES TO RELATED APPLICATIONS

Not applicable.

BACKGROUND

1. Field of the Invention

The present invention relates to a passivation composition and a method of forming a conductive pattern by using the passivation composition. Specifically, the present invention relates to a passivation composition comprising an oxidizing agent and an inorganic base and a method of forming a conductive pattern by using the passivation composition.

2. Descriptions of the Related Art

Recently, with vigorous development of flat displays such as liquid crystal displays, plasma display panels, and touch screens, the development of the transparent electrode material for these devices has gained increasing attention. Generally, the material of transparent electrodes could be roughly divided into two categories, i.e., conductive metal oxides and conductive polymers. The examples of conductive metal oxides include indium tin oxide (ITO), aluminum-doped zinc oxide (AZO), gallium-doped zinc oxide (GZO), etc. Even these metal oxides have superior conductivities, but their applications are still limited due to their poor flexibility (i.e., poor elasticity and crisp character), high price (especially ITO) and high production costs. Especially, they are not suitable for flexible displays. The examples of conductive polymer include polythiophene, polyaniline, polyacetylene, polypyrrole, etc. The conductive polymer has gained increasing prominence due to their low-price and superior flexibilities.

Conventional methods for forming an electrode pattern of a display device using a conductive polymer may be roughly divided into etching and passivating methods. The etching method comprises the steps of forming a conductive polymer layer on a (transparent) substrate, covering a predetermined circuit area (i.e. a conductive area) with a mask, and then removing the conductive polymer at the non-circuit area (i.e. a non-conductive area) by using an etching agent to provide a patterned circuit. However, the product prepared by an etching method usually encounters problems such as height drop and dark lines resulting from different optical contrast because the conductive polymer only remains on a part of the substrate (only on the conductive area but not on the non-conductive area). In view of this, passivating methods are developed.

A conventional passivating method comprises passivating the conductive polymer material of non-circuit area to significantly reduce the conductivity of the non-circuit area to provide a desired patterned circuit by using an oxidizing agent. Although the conventional passivating method could solve the problems of height drop and optical contrast difference, it still has some deficiencies, such as insufficient passivating effect and poor durability of the product.

For example, TW 552591 discloses a method of manufacturing conductive pattern, which prints a solution with an oxidizing agent (as a passivating agent) onto the conductive polymer layer on the substrate to passivate the printed conductive polymer material to form a non-conductive area. However, the above described process has the following defects. First, the oxidizing agent is provided with flowability. The circuit area is not protected or isolated. The oxidizing agent may also etch the conductive material of the circuit area and as a result, distort the conductive pattern. The conductive pattern may be further etched during the subsequent washing and removal process of the oxidizing agent. Second, the viscosity of the oxidizing agent is usually increased to reduce its flowability to lower the influence of the oxidizing agent to the conductive pattern. However, this will inevitably slow down the spread of the oxidizing agent. There is, therefore, a contradiction between the passivating time and the passivating effect. In addition, in the conventional passivating method, the oxidizing agent only passivates the superficial part of a conductive polymer layer, the passivated part tends to be worn out to thereby expose the un-passivated part of the conductive polymer layer after a long-term use, and this will cause a short circuit. JP 2011-054617A discloses another one method of forming a conductive pattern, comprising providing a pattern film containing a passivating agent, and then forming conductive pattern by contacting the pattern film with a conductive polymer layer to passivate the contacted conductive polymer material. However, the method still can only passivate the superficial part of the conductive polymer layer. The problem of durability still exists, and moreover, the passivating effect is not sufficient because the level of the difference of the conductivities between the passivated area and the un-passivated area are merely about $10^5$ to $10^6$ times high.

The present invention provides a passivation composition for forming a conductive pattern and a method of using the passivation composition to form a conductive pattern. The passivating speed of the passivation composition of the present invention is fast. The passivating time therefore could be shortened, while the passivating effect provided by the passivation composition of the present invention is excellent because the variation of the conductivities before and after the passivating process reaches at least about $10^{12}$ times high. The passivation composition of the present invention could especially passivate the deep material of a conductive polymer layer and thereby, could improve the durability problem encountered due to the wear of the passivated material.

SUMMARY

An objective of the present invention is to provide a passivation composition, comprising an oxidizing agent, an inorganic base with a general formula $M(OH)_n$, and a solvent, wherein M is a metal ion and n is the valence number of the metal ion.

Another objective of the present invention is to provide a method of forming a conductive pattern on a substrate, comprising the following steps: (a) forming a polymer conductive layer on a substrate, wherein the polymer conductive layer is consisting of a first area and a second area, while the first area is corresponding to a conductive area to be formed; and (b) passivating the second area by using the passivation composition of the present invention to reduce the conductivity of the second area and form the conductive pattern on the substrate.

To render the above objectives, technical features and advantages of the present invention more apparent, the present invention will be described in detail with reference to some embodiments hereinafter.

BRIEF DESCRIPTION OF THE DRAWINGS

FIGS. 1-1 to 1-4 show broken line graphs of the variation in haze, transparency, and resistance of conductive substrates after being soaked in de-ionized water, an oxidizing agent ($Na_2S_2O_8$), sulfuric acid, and NaOH, respectively.

FIGS. 2-1 to 2-3 show 3D bar graphs of normalized values in Table 3-1 to 3-3, respectively (Tables 3-1 to 3-3 respectively show the measurements of the variation in haze, transparency, and resistance of the conductive substrate after being passivated by using the passivation composition of the present invention).

FIGS. 3-1 to 3-3 show bar graphs of the variation in haze, transparency, and resistance of a conductive substrate after being passivated by one embodiment of the passivation composition of the present invention.

DETAILED DESCRIPTION

Hereinafter, some embodiments in accordance with the present invention will be described in detail. However, without departing from the spirit of the present invention, the present invention may be embodied in various embodiments and should not be limited to the embodiments described in the specification. Furthermore, unless it is additionally explained, the expressions "a", "the", or the like recited in the specification of the present invention (especially in the claims) should comprise both the singular and the plural forms. The expression "about" implies acceptable errors of specific values determined by persons with ordinary skill in the art. Acceptable errors depend on the method of measurement.

The passivation composition of the present invention is obtained through the combination use of an oxidizing agent with passivating ability and an inorganic base. Without being restricted by theories, it is believed that the inorganic base added in the passivation composition of the present invention could act as an etching agent to etch a part of conductive polymer material of the conductive polymer layer on the substrate to form several etch pits on the surface of the conductive polymer layer. As a result, the surface area of the conductive polymer layer that comes into contact with the passivation agent is increased and therefore, the passivating speed is increased, the required passivating time is reduced, and the deep conductive polymer material could be passivated. Therefore, the present invention can resolve the problem of short circuiting due to a superficial passivation and thus, improve the durability of a device. Furthermore, the variation of the conductivity of the conductive polymer material before and after being passivated by the passivation composition of the present invention could reach at least about $10^{12}$ times high.

Particularly, the passivation composition of the present invention comprises an oxidizing agent, an inorganic base having a general formula $M(OH)_n$, and a solvent, wherein M is a metal ion and n is the valence number of the metal ion.

The oxidizing agent of the passivation composition of the present invention is not particularly limited and could be any conventional oxidizing agents. For example, the oxidizing agent may be selected from the group consisting of $S_2O_8^{2-}$, $ClO^-$, $MnO^{4-}$, $BrO^-$, $Cr_2O_7^{2-}$, $H_2O_2$, and combinations thereof. The oxidizing agent is preferably $S_2O_8^{2-}$, $ClO^-$ or a combination thereof. The oxidizing agent may be provided as a compound, e.g., an acid or a salt. For example, $S_2O_8^{2-}$ may be provided by sodium persulfate ($Na_2S_2O_8$) and $ClO^-$ may be provided by hypochlorous acid (HClO). The amount of the oxidizing agent is not particularly limited. However, to ensure a sufficient passivating effect, the amount of the oxidizing agent generally ranges from about 0.4 wt % to about 40 wt % and preferably about 5 wt % to about 20 wt %, based on the weight of the passivation composition. If the amount of the oxidizing agent is less than 0.4 wt %, a desired passivating effect may be insufficient. If the amount of the oxidizing agent is more than 40 wt %, there may be precipitation residue derived from the oxidizing agent which is hard to be removed. It should be noted that in the case where the oxidizing agent is provided as a compound, e.g., an acid or a salt, the ratio of the oxidizing agent in the passivation composition of the present invention is based on the oxidizing group of the compound. For example, if sodium persulfate ($Na_2S_2O_8$) is used, the amount of the oxidizing agent is evaluated according to the amount of "$S_2O_8^{2-}$". In some embodiments of the present invention, sodium persulfate and hypochlorous acid (HClO) are used to provide the desired oxidizing agent.

In the passivation composition of the present invention, the inorganic base provides not only an etching effect but also a basic environment suitable for the oxidizing agent, such that the passivation composition of the present invention could conduct a fast and excellent passivation. Consequently, the required processing time for the passivation is quite short (about tenths of seconds to about several minutes, such as about 30 seconds to about 240 seconds). The inorganic base will therefore just etch a portion of the surface of the conductive polymer layer to form dents (such as nicks and etch pits) on the surface, rather than etching the whole surface of the conductive polymer layer to thereby generate a variance in thickness. Therefore, there is no macroscopic height drop that exists in the passivated polymer layer to generate a dark line problem due to different optical contrast. The optical properties of the passivated polymer material, such as transparency and haze, will not be affected. The inorganic base itself is non-volatile and therefore is stable under a long-term operation and will not volatilize to adversely pollute the environment.

The inorganic base that is useful in the passivation composition of the present invention has a general formula $M(OH)_n$, wherein M is a metal ion and n is the valence number of the metal ion. The examples of the inorganic base may be one or more of the metal oxides of group IA or IIA, including but not limited to those selected from the group consisting of KOH, NaOH, $Ca(OH)_2$, RbOH, $Sr(OH)_2$, CsOH, $Ba(OH)_2$, and combinations thereof. There is preference given to KOH, NaOH or a combination thereof. Generally, the amount of the inorganic base ranges from about 0.2 wt % to about 20 wt %, and preferably from about 3 wt % to about 15 wt %, based on the total weight of the passivation composition. If the amount of the inorganic base is less than about 0.2 wt %, the desired etching effect may not be achieved. If the amount of the inorganic base is more than about 20 wt %, the inorganic base may excessively etch the material of the conductive polymer layer and thereby cause a height drop or a deterioration of optical properties (such as transparency). In some embodiments of the passivation composition of the present invention, NaOH is used as the inorganic base and the amount thereof is about 0.4 wt % to about 4 wt % based on the total weight of the passivation composition.

The solvent of the passivation composition of the present invention is not particularly limited and can be any inert solvent that could dissolve but not react with the inorganic base and the oxidizing agent. The examples of the solvent include but not limited to that selected from the group consisting of deionized water, methanol, ethanol, propanol, isopropanol, and the combinations thereof, where the preference is given to deionized water. In some embodiment of the present invention, deionized water is adopted.

The present invention further provides a method of forming a conductive pattern, comprising the following steps: (a) forming a polymer conductive layer on a substrate, wherein the polymer conductive layer is consisting of a first area and a second area and the first area is corresponding to a conductive pattern to be formed; and (b) passivating the second area by using the passivation composition of the present invention to reduce the conductivity of the second area and form the conductive pattern on the substrate.

The step of forming a polymer conductive layer on the substrate (step (a)) may be conducted by any method known for persons with ordinary skill in the art and is not particularly limited. Examples of the method include but are not limited to spin coating, dip coating, die coating, spray coating, blade coating, roll coating, screen printing, and inkjet printing, etc. The types of the substrate that are useful in the present invention are not particularly limited and may be selected by users depending on needs. For example, the material of the substrate may be but not limited to glass, polyethylene terephthalate (PET), polyethylene naphthalate (PEN), polymethylmethacrylate (PMMA), polycarbonate (PC), or a combination thereof. The material of the polymer conductive layer could be any conventional conductive polymers. The examples of the conventional conductive polymers may be but are not limited to polythiophene-based material, polyaniline-based material, polypyrrole-based material, or a mixture thereof, where the preference is given to polythiophene-based material. The examples of the polythiophene-based material are selected from the group consisting of poly(3-hexylthiophene), poly(3,4-ethlenedioxytiophene) (PEDOT), poly(3,4-ethylenedioxythiophene):poly(styrenesulfonate) (PEDOT:PSS), poly(3,4-ethylenedioxythiophene):poly(vinylsulfonic acid) (PEDOT:PVS), and combinations thereof, but are not limited thereto. In some embodiments of the present invention, PET substrate and PEDOT:PSS conductive polymer material are adopted.

The passivation process of step (b) may be performed by a method selected from the group consisting of a soaking method, a gravure printing method, a relief printing method, an ink-jet-printing method, a pen printing method, and a screen printing method, but is not limited thereto.

The fast passivating ability of the passivation composition of the present invention especially contributes to that the passivation process of step (b) could be accomplished by a simple soaking method without the needs of complicated printing steps. The detailed operating steps of a soaking method and the preparation of the anti-passivation film used in the soaking method are irrelevant to the technical features of the present invention and can be selected by persons with ordinary skill in the art depending on their needs after reviewing the disclosure of the specification. For example, the passivating process of step (b) may be carried out by but is not limited to following steps: (b-1) applying an anti-passivation film on the first area to cover the first area, protecting the first area corresponding to the predetermined conductive area from passivation; (b-2) soaking the conductive substrate into the passivation composition of the present invention to perform the passivation process to reduce the conductivity of the second area; and (b-3) washing the passivated conductive substrate with inert solvent such as deionized water and methanol, and then removing the anti-passivation film from the conductive substrate to obtain the conductive substrate with the desired conductive pattern. The anti-passivation film is consisted of a material that will not be passivated by the passivation composition; it may be an alkali-resistant oxidizing agent-resistant peelable adhesive or dry film, or any other known materials that could provide the function of anti-passivating.

The passivation composition of the present invention could provide a significant passivating effect in an extremely short time, and therefore, the duration of the passivating process of step (b) only requires tens of seconds to several minutes long. An over long duration of the passivating process may lead to the excessive etching of the substrate to thereby cause problems such as height difference and side etching and thus, is not suitable. In some embodiments of the present invention, the passivation process of the step (b) is performed by means of a soaking method. The duration of the passivating process is about 30 seconds to about 240 seconds.

The present invention will be further illustrated by the embodiments hereinafter; however, those illustrated embodiments are only for illustration and the scope of the present invention should not be limited thereto.

EXAMPLES

Measuring Methods of the Variation of Transparency, Resistance, and Haze

The measuring methods of the variation of transparency, resistance, and haze are shown in Table 1.

TABLE 1

| | Measuring methods and instruments |
|---|---|
| Resistance (Ω/square) | Four-pin type LORESTA-GP MCP-T600, MITSUBISHI CHEMICAL |
| Transparency (%) | Measuring method: JIS K7361 NDH5000W, Nippon Denshoku |
| Haze (%) | Measuring method: JIS K7361 NDH5000W, Nippon Denshoku |

[Preparation of Conductive Substrate]

A PET substrate was coated with a dispersion solution of PEDOT:PSS by roll coating and then dried at a temperature of 120 to form a polymer conductive layer on the PET substrate to provide a conductive substrate.

[Soaking Test]

The prepared substrates were respectively soaked with deionized water, 10 wt % of $Na_2S_2O_8$ (oxidizing agent) solution, 9.8 wt % of $H_2SO_4$ (acid) solution, and 4 wt % of NaOH (base) solution for 30 seconds to 240 seconds (30 seconds per interval). The variations of the transparency, resistance and haze of the conductive substrates were measured and recorded and the results are shown in FIGS. 1-1 to 1-4.

As shown in FIGS. 1-1 to 1-4, there is no significant variation in regardless of transparency, resistance and haze after the conductive substrate being soaked with 100 wt % of deionized water (FIG. 1-1) or the 10 wt % oxidizing agent $Na_2S_2O_8$ contained solution (FIG. 1-2). The result shows that in the case where only oxidizing agent is used, the composition is neutral and therefore, is unable to provide a suitable reaction condition to passivate the conductive substrate. No etching effect is provided because there is no significant variation in haze. In addition, as shown in FIGS. 1-3 and 1-4, after the conductive substrate is soaked in 9.8 wt % of $H_2SO_4$ solution (FIG. 1-3) or 4 wt % of NaOH solution (FIG. 1-4) for a long time, its haze shows a tendency to increase. The result shows that if the conductive substrate is treated with a basic solution or an acid solution for too long, the optical properties of the conductive substrate will be affected. This might owe to the etching of strong acid and strong base to the surface of the conductive substrate.

Example 1

Passivating Test

According to the ratio shown in Table 2, passivation composition 1-1, passivation composition 1-2, passivation composition 1-3, passivation composition 1-4, passivation composition 1-5, passivation composition 1-6, passivation composition 1-7, and passivation composition 1-8 were prepared. Conductive substrates were respectively soaked with one of the passivation compositions for 30 seconds to 240 seconds (every 30 seconds as an interval), and the variations of their transparency, resistance and haze were measured. The results are shown in Tables 3-1 to 3-3, FIGS. 2-1 to 2-3, and FIGS. 3-1 to 3-3.

TABLE 2

| Passivation composition | $Na_2S_2O_8$ | Deionized water | NaOH | pH value |
|---|---|---|---|---|
| 1-1 | 4.98 wt % | 94.65 wt % | 0.40 wt % | 13 |
| 1-2 | 9.96 wt % | 89.64 wt % | 0.40 wt % | 13 |
| 1-3 | 14.94 wt % | 84.66 wt % | 0.40 wt % | 13 |
| 1-4 | 19.92 wt % | 79.68 wt % | 0.40 wt % | 13 |
| 1-5 | 4.81 wt % | 91.35 wt % | 3.85 wt % | 14 |
| 1-6 | 9.62 wt % | 86.54 wt % | 3.85 wt % | 14 |
| 1-7 | 14.42 wt % | 81.73 wt % | 3.85 wt % | 14 |
| 1-8 | 19.23 wt % | 76.92 wt % | 3.85 wt % | 14 |

TABLE 3-1

Transparency at the room temperature (%)

| Passivation composition | Passivating time | | | | | | | |
|---|---|---|---|---|---|---|---|---|
| | 0 second | 30 seconds | 60 seconds | 90 seconds | 120 seconds | 150 seconds | 180 seconds | 240 seconds |
| 1-1 | 86.39 | 85.73 | 85.6 | 86.55 | 86.34 | 86.08 | 86.28 | 86.16 |
| 1-2 | 87.24 | 86.02 | 86.07 | 85.38 | 86.08 | 85.85 | 86.08 | 85.94 |
| 1-3 | 87.25 | 85.86 | 85.37 | 85.43 | 85.2 | 85.3 | 85.39 | 85.64 |
| 1-4 | 87.08 | 84.66 | 84.6 | 84.37 | 84.63 | 84.46 | 85.05 | 84.46 |
| 1-5 | 86.78 | 85.56 | 85.43 | 85.58 | 85.52 | 85.63 | 85.34 | 85.6 |
| 1-6 | 86.9 | 85.51 | 86.23 | 85.73 | 85.67 | 85.68 | 85.8 | 86.06 |
| 1-7 | 87.13 | 85.9 | 86.12 | 86.02 | 86.27 | 85.6 | 85.9 | 86.31 |
| 1-8 | 87.14 | 85.99 | 85.83 | 85.68 | 85.87 | 85.84 | 85.97 | 86.56 |

TABLE 3-2

Resistance at the room temperature (Ω/square)

| Passivation composition | Passivating time | | | | | | | |
|---|---|---|---|---|---|---|---|---|
| | 0 second | 30 seconds | 60 seconds | 90 seconds | 120 seconds | 150 seconds | 180 seconds | 240 seconds |
| 1-1 | 390 | 1090 | 914 | 1244 | 1342 | 1850 | 2552 | 5353 |
| 1-2 | 389 | 886 | 3283 | 2774 | 2912 | 6035 | 14630 | 23310 |
| 1-3 | 434 | 1102 | 2664 | 7242 | 10380 | 20400 | 111500 | 3147000 |
| 1-4 | 424 | 1360 | 3167 | 1648 | 38200 | 346000 | 693700 | 1E+15 |
| 1-5 | 389 | 4460 | 6040 | 5440000 | 15200000 | 1E+15 | 1E+15 | 1E+15 |
| 1-6 | 443 | 8240 | 1E+15 | 1E+15 | 1E+15 | 1E+15 | 1E+15 | 1E+15 |
| 1-7 | 473 | 20290 | 1E+15 | 1E+15 | 1E+15 | 1E+15 | 1E+15 | 1E+15 |
| 1-8 | 460 | 45910 | 1E+15 | 1E+15 | 1E+15 | 1E+15 | 1E+15 | 1E+15 |

TABLE 3-3

Haze at the room temperature (%)

| Passivation composition | Passivating time | | | | | | | |
|---|---|---|---|---|---|---|---|---|
| | 0 second | 30 seconds | 60 seconds | 90 seconds | 120 seconds | 150 seconds | 180 seconds | 240 seconds |
| 1-1 | 2.2 | 2.03 | 1.68 | 2.01 | 1.87 | 1.81 | 2.03 | 2.58 |
| 1-2 | 2.72 | 2.41 | 2.57 | 1.82 | 2.4 | 2.41 | 2.35 | 2.31 |
| 1-3 | 2.26 | 2.17 | 2.32 | 1.82 | 1.96 | 1.91 | 2.68 | 2.48 |
| 1-4 | 2.73 | 1.69 | 1.59 | 1.68 | 1.73 | 1.89 | 1.81 | 1.85 |

TABLE 3-3-continued

| | Haze at the room temperature (%) | | | | | | | |
|---|---|---|---|---|---|---|---|---|
| | Passivating time | | | | | | | |
| Passivation composition | 0 second | 30 seconds | 60 seconds | 90 seconds | 120 seconds | 150 seconds | 180 seconds | 240 seconds |
| 1-5 | 2.52 | 2.55 | 2.46 | 2.18 | 2.37 | 2.43 | 2.62 | 2.26 |
| 1-6 | 3.17 | 2.79 | 2.31 | 2.09 | 2.27 | 2.64 | 2.23 | 2.7 |
| 1-7 | 2.84 | 2.73 | 2.38 | 2.56 | 2.7 | 2.82 | 2.69 | 2.19 |
| 1-8 | 2.4 | 2.46 | 2.34 | 2.28 | 2.31 | 2.15 | 2.42 | 2.04 |

As shown in Table 3-1, FIG. 2-1, and FIG. 3-1, after the passivating process, the transparency of the conductive substrate almost remains the same. As shown in Table 3-3, FIG. 2-3 and FIG. 3-3, as the soaking time increases, the transparency of the conductive substrate only slightly changes. These results manifest that the passivation composition of the present invention would not deteriorate the optical properties of the conductive substrate and is therefore suitable for electronic products with strict requirements on optical properties. Moreover, as shown in Table 3-2 and FIG. 2-2, in the low NaOH content situation (pH value=13), a high oxidizing agent concentration is required for obtaining the desired passivating effect (passivation composition 1-4). In comparison, in the high NaOH content situation (pH value=14), a fast passivating effect could be provided (passivation compositions 1-5, 1-6, 1-7, and 1-8) and the resistance variation of the conductive substrate before and after the passivation reaches at least about $10^{12}$ times, and especially, in the case of passivation composition 1-6, only 60 seconds are required to achieve the significant passivating effect (see FIG. 3-2).

Example 2

Influences of the Types of the Oxidizing Agent

The preparation methods of passivation composition 1-6 were repeated to prepare passivation composition 2, except that the oxidizing agent $Na_2S_2O_8$ was replaced by NaClO. A conductive substrate was soaked with the passivation composition 2 for 30 seconds to 240 seconds (30 seconds per interval). The variations of the transparency, resistance, and haze of the conductive substrate were measured, and the results are shown in FIG. 4.

Figure 4:
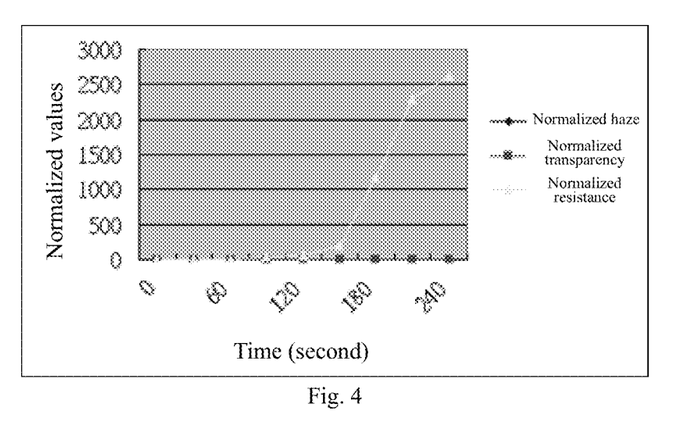
FIG. 4 shows a broken line graph of the variation in haze, transparency, and resistance of a conductive substrate after being passivated by another one embodiment of the passivation composition of the present invention.

As shown in FIG. 4, even changing the type of the oxidizing agent to NaClO, the passivation composition of the present invention still could provide an excellent passivating effect without adversely affecting the optical properties of the conductive substrate.

Comparative Example 1

The Use of a Strong Acid as an Etching Agent

Comparative passivation composition 1 was prepared by replacing the etching agent NaOH with sulfuric acid, wherein the amount of $Na_2S_2O_8$ was 9.62 wt %, the amount of deionized water was 85.61 wt %, and the amount of sulfuric acid was 4.76 wt %. A conductive substrate was soaked with the comparative passivation composition 1 for 30 seconds to 240 seconds (every 30 seconds as an interval). The variations of the transparency, resistance, and haze of the conductive substrate were measured, and the results are shown in FIG. 5.

Figure 5:
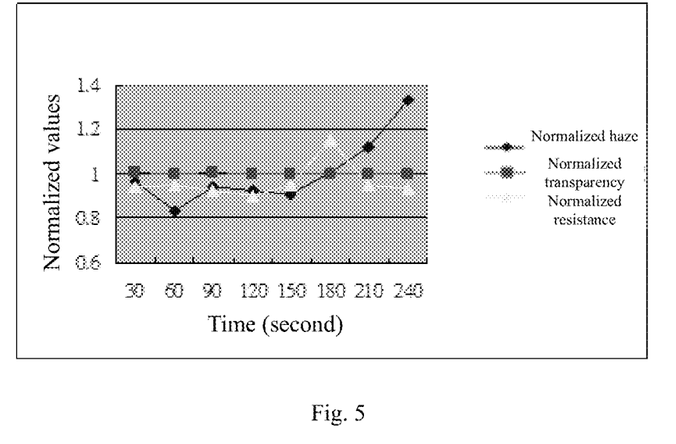
FIG. 5 shows a broken line graph of the variation in haze, transparency, and resistance of a conductive substrate after being passivated by the comparative passivation composition 1.

As shown in FIG. 5, the comparative passivation composition 1 could not provide the desire passivating effect, and the variation of haze is much more significant, which shows that the influence on the optical properties of the conductive substrate was relatively apparent. This result shows that an acidic condition could not provide a suitable passivation condition for an oxidizing agent.

Comparative Example 2

Replacing the Oxidizing Agent with a Reducing Agent and Using a Strong Acid as an Etching Agent The preparation method of Comparative example 1 was repeated to prepare comparative passivating composition 2, except $Na_2S_2O_8$ was replaced by a reducing agent $H_2C_2O_4$. A conductive substrate was soaked with the comparative passivation composition 2 for 30 seconds to 240 seconds (30 seconds per interval). The variation of the transparency, resistance, and haze of the conductive substrate were measured, and the results are shown in FIG. 6.

Figure 6:
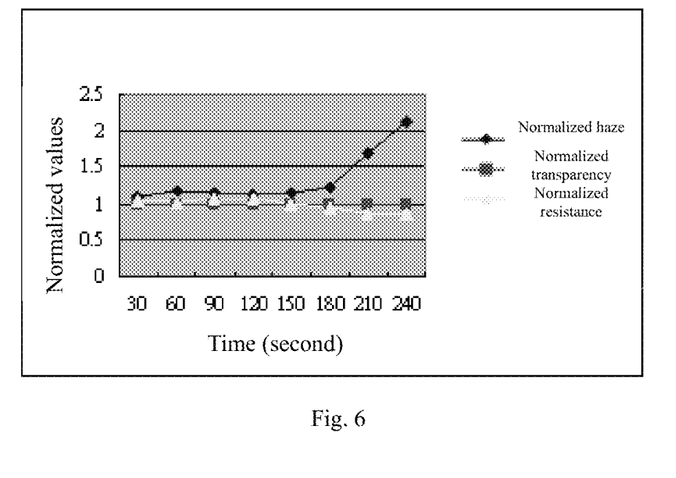
FIG. 6 shows a broken line graph of the variation in haze, transparency, and resistance of a conductive substrate after being passivated by the comparative passivation composition 2.
Figure 11:
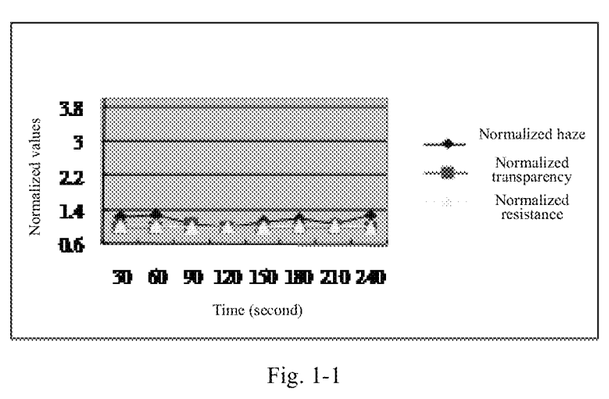
Figure 12:
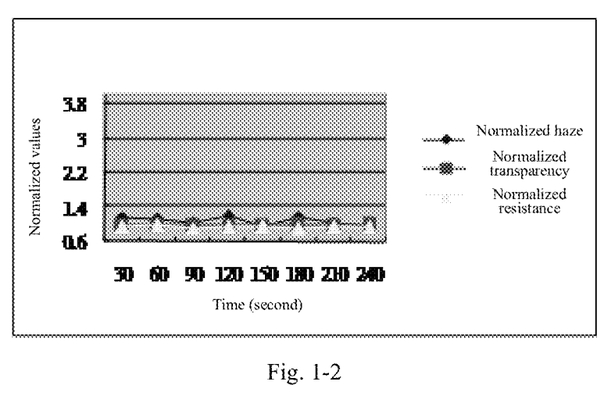
Figure 13:
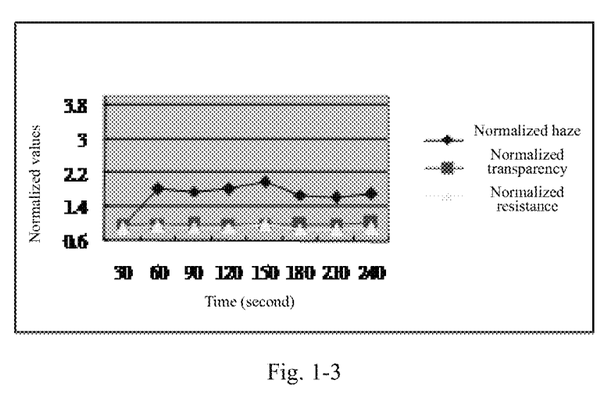
Figure 14:
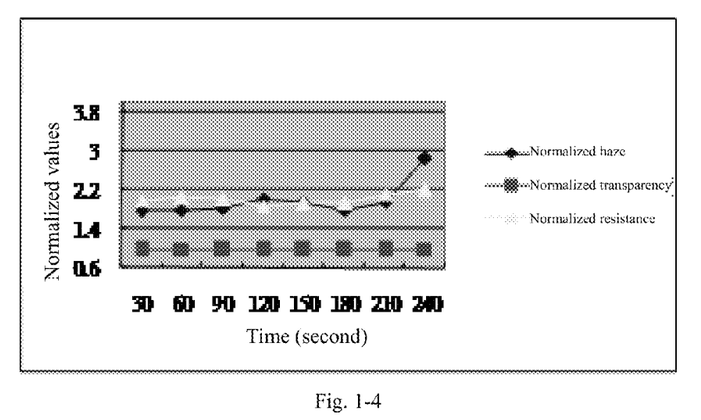
Figure 21:
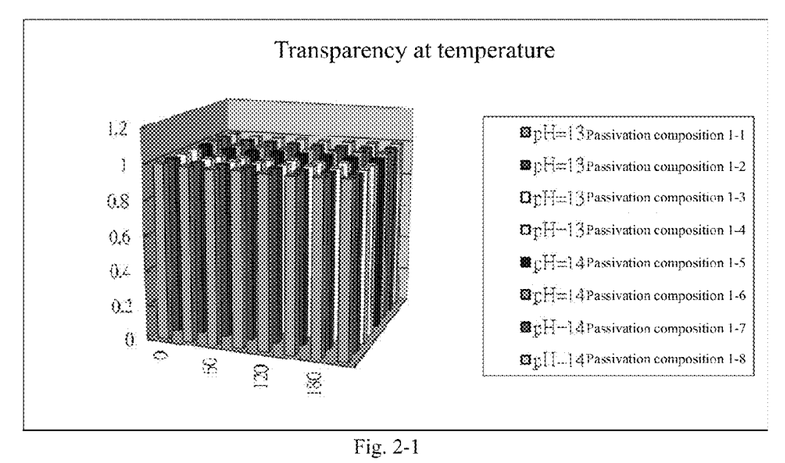
Figure 22:
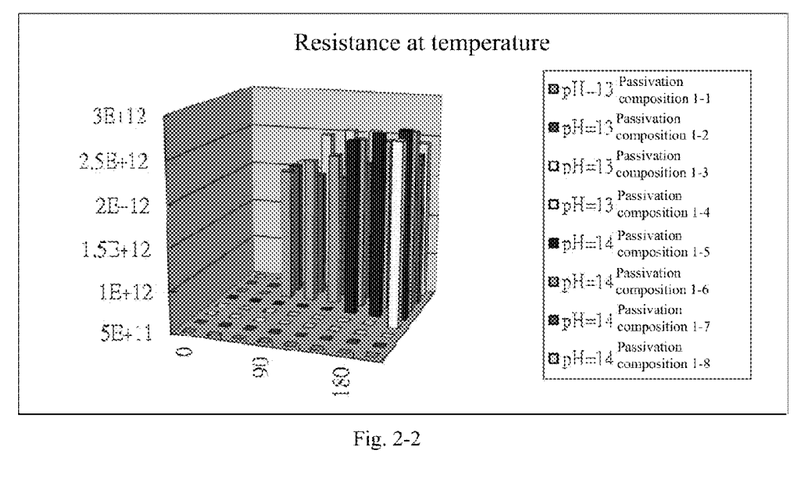
Figure 23:
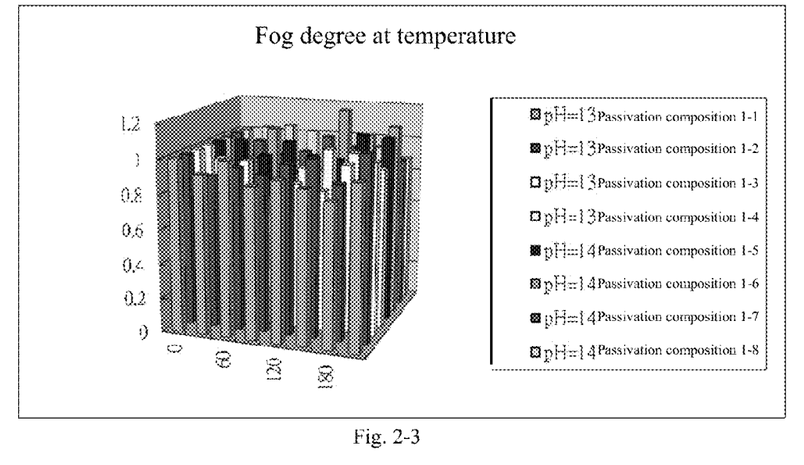
Figure 31:
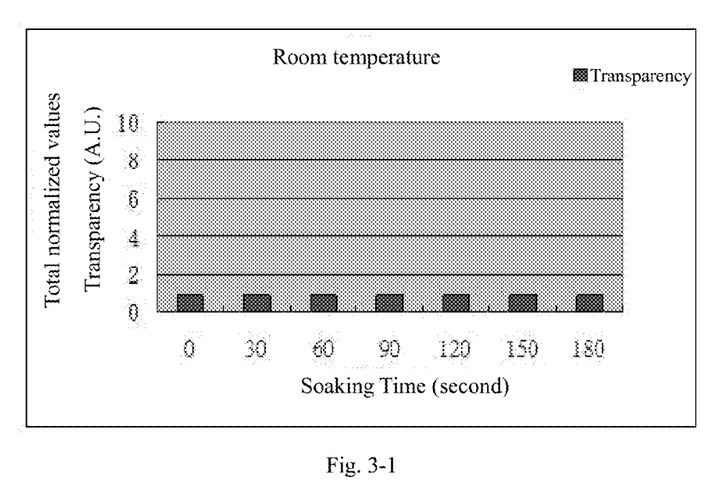
Figure 32:
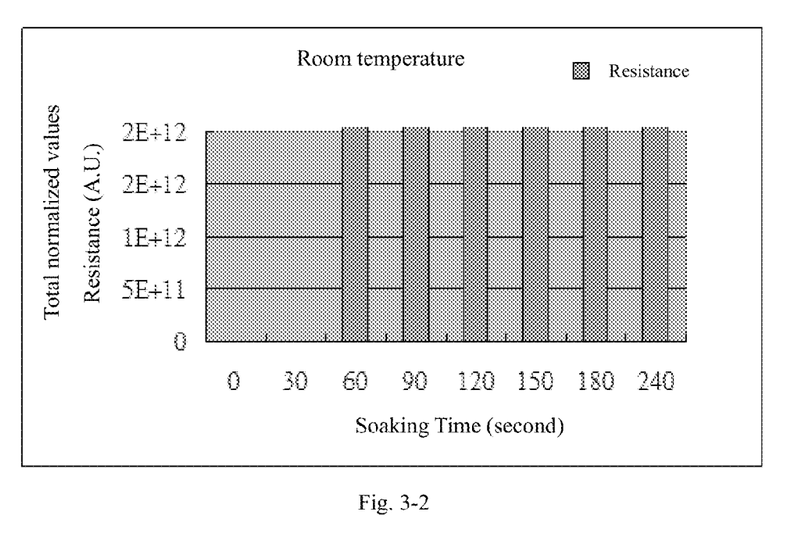
Figure 33:
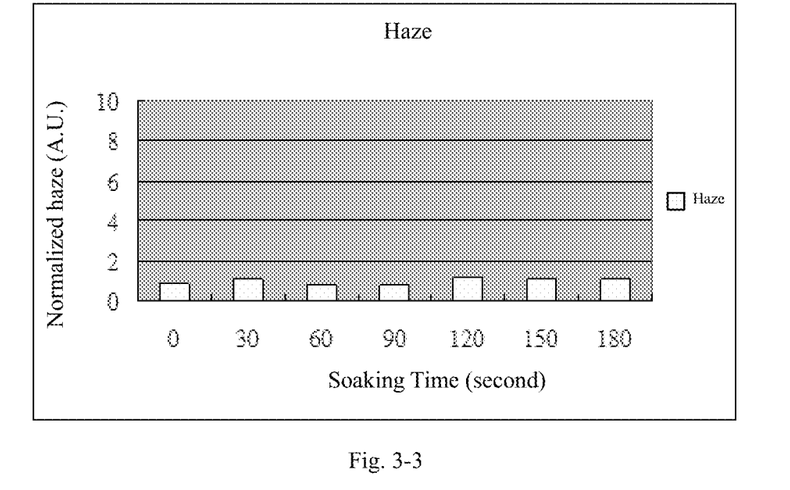

As shown in FIG. 6, haze is changed but almost no variation in resistance is observed. It shows that the reducing agent could not provide any passivating effect.

The examples described above are only for exemplarily explaining the principle and effects of the present invention, and illustrating the technical features of the present invention, but not for limiting the scope of the present invention. People skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. A method of forming a conductive pattern on a substrate, comprising the following steps:
   (a) forming a polymer conductive layer on a substrate, wherein the polymer conductive layer is consisting of a first area and a second area and the first area is corresponding to a conductive pattern to be formed; and
   (b) passivating the second area by using a passivation composition to reduce the conductivity of the second area and form the conductive pattern on the substrate,
   wherein the passivating process of the step (b) is performed by a soaking method comprising the following steps:
   (b-1) applying an anti-passivation film on the first area to cover the first area;
   (b-2) soaking the conductive substrate into the passivation composition to perform the passivation process to reduce the conductivity of the second area; and
   (b-3) removing the anti-passivation film from the conductive substrate after the passivation process,
   wherein the passivation composition comprises an oxidizing agent, an inorganic base having a general formula M(OH)$_n$ and a solvent, M is a metal ion and n is the valence number of the metal ion, and wherein based on the total weight of the passivation composition, the amount of the oxidizing agent ranges from about 5 wt % to about 19.92 wt %, and the amount of the inorganic base ranges from about 0.2 wt % to about 20 wt %.

2. The method of claim 1, wherein the oxidizing agent is selected from the group consisting of $S_2O_8^{2-}$, $ClO^-$, $MnO_4^-$, $BrO^-$, $Cr_2O_7^{2-}$, $H_2O_2$, and combinations thereof.

3. The method of claim 2, wherein the oxidizing agent is $S_2O_8^{2-}$, $ClO^-$, or a combination of $S_2O_8^{2-}$ and $ClO^-$.

4. The method of claim 1, wherein the inorganic base is selected from the group consisting of KOH, NaOH, Ca(OH)$_2$, RbOH, Sr(OH)$_2$, CsOH, Ba(OH)$_2$, and combinations thereof.

5. The method of claim 4, wherein the inorganic base is KOH, NaOH, or a combination of KOH and NaOH.

6. The method of claim 1, wherein the solvent is selected from the group consisting of deionized water, methanol, ethanol, propanol, isopropanol, and combinations thereof.

* * * * *